United States Patent
Brenner et al.

(10) Patent No.: US 6,904,584 B2
(45) Date of Patent: Jun. 7, 2005

(54) METHOD AND SYSTEM FOR PLACING LOGIC NODES BASED ON AN ESTIMATED WIRING CONGESTION

(75) Inventors: Ulrich Brenner, Siegburg (DE); Philip S. Honsinger, Poughkeepsie, NY (US); Juergen Koehl, Weil im Schoenbuch (DE); Bernhard Korte, Alfter/Impekoven (DE); Andre Rohe, Bonn (DE); Jens P. Vygen, Bonn (DE)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 10/063,633

(22) Filed: May 6, 2002

(65) Prior Publication Data

US 2003/0208737 A1 Nov. 6, 2003

(51) Int. Cl.[7] ............................................. G06F 17/50
(52) U.S. Cl. ........................ 716/13; 716/14; 716/9; 716/10; 716/5; 716/7
(58) Field of Search ............................. 716/9, 10, 13, 716/14, 5, 7

(56) References Cited

U.S. PATENT DOCUMENTS

| | | | | |
|---|---|---|---|---|
| 4,890,238 A | * | 12/1989 | Klein et al. | 716/7 |
| 5,124,273 A | * | 6/1992 | Minami | 716/14 |
| 5,640,327 A | * | 6/1997 | Ting | 716/7 |
| 5,856,927 A | * | 1/1999 | Greidinger et al. | 716/12 |
| 5,930,499 A | * | 7/1999 | Chen et al. | 716/6 |
| 6,110,222 A | * | 8/2000 | Minami et al. | 716/9 |
| 6,192,508 B1 | * | 2/2001 | Malik et al. | 716/9 |
| 6,286,128 B1 | * | 9/2001 | Pileggi et al. | 716/18 |
| 6,314,547 B1 | * | 11/2001 | Donath et al. | 716/8 |
| 6,367,051 B1 | * | 4/2002 | Pileggi et al. | 716/2 |
| 6,557,145 B2 | * | 4/2003 | Boyle et al. | 716/2 |
| 6,651,232 B1 | * | 11/2003 | Pileggi et al. | 716/7 |
| 6,778,999 B2 | * | 8/2004 | Hathaway | 707/104.1 |
| 6,792,582 B1 | * | 9/2004 | Cohn et al. | 716/7 |
| 2001/0003843 A1 | * | 6/2001 | Scepanovic et al. | 716/7 |
| 2001/0009031 A1 | * | 7/2001 | Nitta et al. | 716/13 |
| 2001/0010090 A1 | * | 7/2001 | Boyle et al. | 716/2 |
| 2001/0014965 A1 | * | 8/2001 | Hiraga | 716/13 |
| 2002/0087940 A1 | * | 7/2002 | Greidinger et al. | 716/2 |
| 2002/0170020 A1 | * | 11/2002 | Darden et al. | 716/2 |
| 2003/0005398 A1 | * | 1/2003 | Cho et al. | 716/8 |
| 2003/0182649 A1 | * | 9/2003 | Harn | 716/11 |

OTHER PUBLICATIONS

Yang et al., "Congestion Reduction During Placement Based on Integer Programming", IEEE/ACM International Conference on Computer Aided Design, Nov. 4, 2001, pp. 573–576.*

Eisenmann et al., "Generic Global Placement and Floorplanning", Proceedings of Design Automation Conference, Jun. 15, 1998, pp. 269–274.*

Schulz, "Hierarchical Physical Design System", Proceedings of VLSI and Microelectronic Applications in Intelligent Peripherals and their Interconnection Networks, May 8, 1989, pp. 5/20–5/24.*

Fernandez et al., "Efficient VLSI Layouts for Homogeneous Product Networks", IEEE Transcations on Computers, vol. 46, No. 10, Oct. 1997, pp. 1070–1082.*

(Continued)

*Primary Examiner*—Matthew Smith
*Assistant Examiner*—Phallaka Kik
(74) *Attorney, Agent, or Firm*—Richard M. Kotulak; Hoffman, Warnick & D'Alessandro LLC

(57) ABSTRACT

A method and system for placing logic nodes based on an estimated wiring congestion are provided. Specifically, under the present invention, relative probabilities for potential implementations of wiring interconnects between logic nodes are determined. Then, for each edge between adjacent bins, a total of corresponding relative probabilities is compared to a wiring availability. Based on the comparison, the logic nodes can be placed within wiring constraints.

22 Claims, 7 Drawing Sheets

OTHER PUBLICATIONS

Hou et al., "A New Congestion–Driven Placement Algorithm based on Cell Inflation", Proceedings of the 2001 Asia and South Pacific Design Automation Conference, Jan. 30, 2001, pp. 605–608.*

Sadakane et al., "A Congestion–Driven Placement Improvement Algorithm for Large Scale Sea–of–Gate Arrays", Proceedings o the IEEE 1997 Custom Integrated Circuits Conference, May 5, 1997, pp. 573–576.*

NB8909290, "Method to Improve Chip Wiring", IBM Technical Disclosure Bulletin, vol. 32, No. 4B, Sep. 1989, pp. 290–293 (6 pages).*

NN83102625, "Estimating Chip Wirability by Routing Configuration Averaging", IBM Technical Disclosure Bulletin, vol. 26, No. 5, Oct. 1983, pp. 2625–2633 (12 pages).*

NN7308734, "Prewire Prediction Model", IBM Technical Disclosure Bulletin, vol. 16, No. 3, Aug. 1973, pp. 734–744 (15 pages).*

NNRD454151, "Congestion Driven Placement System Using Mid–Cut Partitioning", IBM Technical Disclosure Bulletin, No. 454, Feb. 1, 2002, p. 318(6 pages).*

NB9406185, "Statistical Mehtod of Noise Estimation in a Synchronous System", IBM Technical Disclosure Bulletin, vol. 37, No. 6B, Jun. 1994, pp. 185–194 (16 pages).*

NN920822, "Global Routing Techniques for Signal Crosstalk Avoidance and Prediction", IBM Technical Disclosure Bulletin, Vo 35, No. 3, Aug. 1992, pp. 22–28 (11 pages).*

NA920371, "Technique to Allocate Space on VLSI Chips for Design Changes", IBM Technical Disclosure Bulletin, vol. 34, No. 10A, Mar. 1992, pp. 71–72 (4 pages).*

NN74033422, "Premaze Runner Analyzer", IBM Technical Disclosure Bulletin, vol. 16, No. 10, Mar. 1976, pp. 3422–3425 (6 pages).*

* cited by examiner

METHOD AND SYSTEM FOR PLACING LOGIC NODES BASED ON AN ESTIMATED WIRING CONGESTION

BACKGROUND OF THE INVENTION

1. Field of the Invention

The present invention generally provides a method and system for placing logic nodes based on an estimated wiring congestion. Specifically, the present invention provides a method and system for placing logic nodes into bins of a chip based on a comparison of an estimated wiring congestion to a wiring availability.

2. Background Art

In the manufacture of microelectronics, circuits and other logic must be placed on chips under certain wireability and timing constraints. Specifically, the nodes must be placed so that the wiring interconnects between the nodes are within the wiring constraints of the chip. Moreover, the wiring interconnects between the logic nodes cannot be placed arbitrarily close to each other. Rather, a certain wiring pitch must be observed. Placement of nodes on a chip is especially problematic when the wiring requirements between the logic nodes approaches the wiring availability. In these situations, the resulting wiring congestion can cause "hot spots" on the chip, which can lead to overload and failure thereof.

Therefore, it is necessary to optimize the placement of logic nodes on the chip so that overload does not occur, while still allowing all required wiring interconnects to be made. Heretofore, attempts have been made to provide improved circuit placement. In general, such attempts begin by positioning the logic nodes on a chip. The chip is then divided/partitioned into a first placement level having four bins or quadrants. The logic nodes are then arranged in the four bins. Next, each of the four bins are partitioned into a second placement level having four sub-bins, and the logic nodes for each bin are arranged in the corresponding sub-bins. The process can then be repeated for subsequent placement levels until a minimum bin size is reached. Although this allows the logic nodes to be physically positioned on the chip, it does not guarantee a wireable chip placement. To provide a wireable chip placement, a user must subsequently either: (1) manually identify the positioned logic nodes that cause wiring congestion and reduce the circuit density accordingly; or (2) reduce the overall chip density by increasing the chip size. In the case of the former, several time-consuming iterations are required. In the case of the latter, increasing the chip size will led to a substantial increase in cost.

In view of the foregoing, there exists a need for a method and system for placing logic nodes based on an estimated wiring congestion. A need also exists for a method and system for placing logic nodes based on relative probabilities that potential implementations of wiring interconnects between logic nodes will cross over an edge of a bin. A further need exists for a method and system for placing logic nodes based on a comparison of an estimated wiring congestion to a wiring availability.

SUMMARY OF THE INVENTION

In general, the present invention provides a method and system for placing logic nodes based on an estimated wiring congestion. Specifically, the logic nodes are initially positioned on a chip (or other device). The chip is then partitioned into four bins and the logic nodes are arranged in the four bins. Then, on this or a subsequent placement level, potential implementations of wiring interconnects between the logic nodes are then identified. Once identified, relative probabilities that the potential implementations will cross over an edge between adjacent bins is then determined for each potential implementation. For each edge between adjacent bins, a total of corresponding relative probabilities is then compared to a wiring availability for identifying overloaded bins. Based on the comparison, a final placement (relocation) of the logic nodes among the bins is performed so that overload is avoided. The process can then be repeated by further partitioning the chip into a subsequent placement level of bins. Summary of the Invention According to a first aspect of the present invention, a method for placing logic nodes based on an estimated wiring congestion is provided. The method comprises the steps of: (1) calculating an estimated wiring congestion for a placement level of bins based on relative probabilities that potential implementations of wiring interconnects between logic nodes in the bins will cross over edges of the bins; (2) comparing the estimated wiring congestion to a wiring availability; and (3) placing the logic nodes in the bins based on the comparison of the estimated wiring congestion to the wiring availability.

According to a second aspect of the present invention, a method for placing logic nodes based on an estimated wiring congestion is provided. The method comprises the steps of: (1) providing a placement grid having a predetermined placement level of bins; (2) calculating relative probabilities for potential implementations of wiring interconnects between logic nodes that will cross over an edge of the bins; (3) comparing, for each edge between adjacent bins, a total of corresponding relative probabilities to a wiring availability for identifying overloaded bins; (4) synthetically adjusting a size of the logic nodes in the overloaded bins based on the comparison; and (5) relocating particular logic nodes from the overloaded bins to non-overloaded bins.

According to a third aspect of the present invention, a system for placing logic nodes based on an estimated wiring congestion is provided. The system comprises: (1) a partition system for partitioning a chip into a placement level of bins; (2) a positioning system for positioning logic nodes in the bins; (3) a probability system for determining relative probabilities for potential implementations of wiring interconnects between the logic nodes that will cross over an edge of the bins; (4) a comparison system for comparing, for each edge between adjacent bins, a total of corresponding relative probabilities to a wiring availability; and (5) a placement system for placing the logic nodes in the bins based on the comparison.

According to a fourth aspect of the present invention, a program product stored on a recordable medium for placing logic nodes based on an estimated wiring congestion is provided. When executed, the program product comprises: (1) program code for partitioning a chip into a placement level of bins; (2) program code for positioning logic nodes in the bins; (3) program code for determining relative probabilities for potential implementations of wiring interconnects between the logic nodes that will cross over edges of the bins; (4) a program code for comparing, for each edge between adjacent bins, a total of corresponding relative probabilities to a wiring availability; and (5) program code for placing the logic nodes in the bins based on the comparison.

Therefore, the present invention provides a method and system for placing logic nodes based on an estimated wiring congestion.

BRIEF DESCRIPTION OF THE DRAWINGS

These and other features of this invention will be more readily understood from the following detailed description of the various aspects of the invention taken in conjunction with the accompanying drawings in which.

Figure 1:
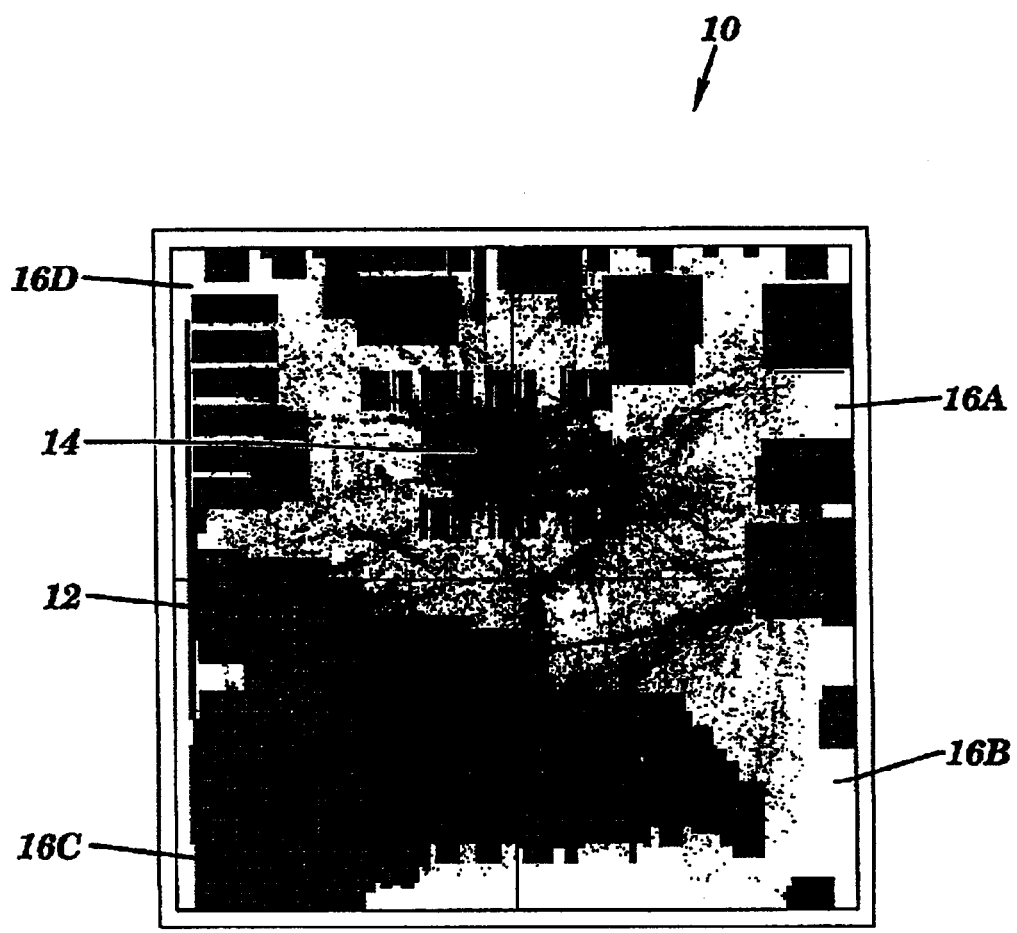
FIG. 1 depicts a chip having logic positioned in four bins/quadrants according to the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

In general, the present invention provides a method and system for placing logic nodes based on an estimated wiring congestion. This allows the logic nodes to be placed within wiring constraints in an efficient manner. As indicated above, previous methods fail to provide such a capability.

Referring now to FIG. 1, a chip 10 having logic nodes 12 and 14 according to the present invention is shown. Logic nodes 12 and 14 typically include circuits, transistors and other nodes known to be placed on a chip 10. As indicated above, previous methods for placing logic on a chip were primarily concerned with geographically fitting the logic. Generally, this included positioning the logic on a chip, partitioning the chip into four bins or quadrants, and then arranging the logic in an overlapping manner in the four bins. In general, the positioning and arranging of the logic nodes was accomplished via quadratic optimization, min-cut or other known operation. In the case of the former, the logic nodes are arranged based on the sum of the squared net lengths between connected nodes (i.e., Euclidean distance). In the case of the latter, the logic nodes are arranged in such a way that the number of interconnects between logic nodes crossing over bins is minimized. Such arrangement of logic, however, failed to address wirability concerns and often resulted in a chip having regions in which the demand for wiring interconnects between logic exceeded the wiring availability.

Figure 2:
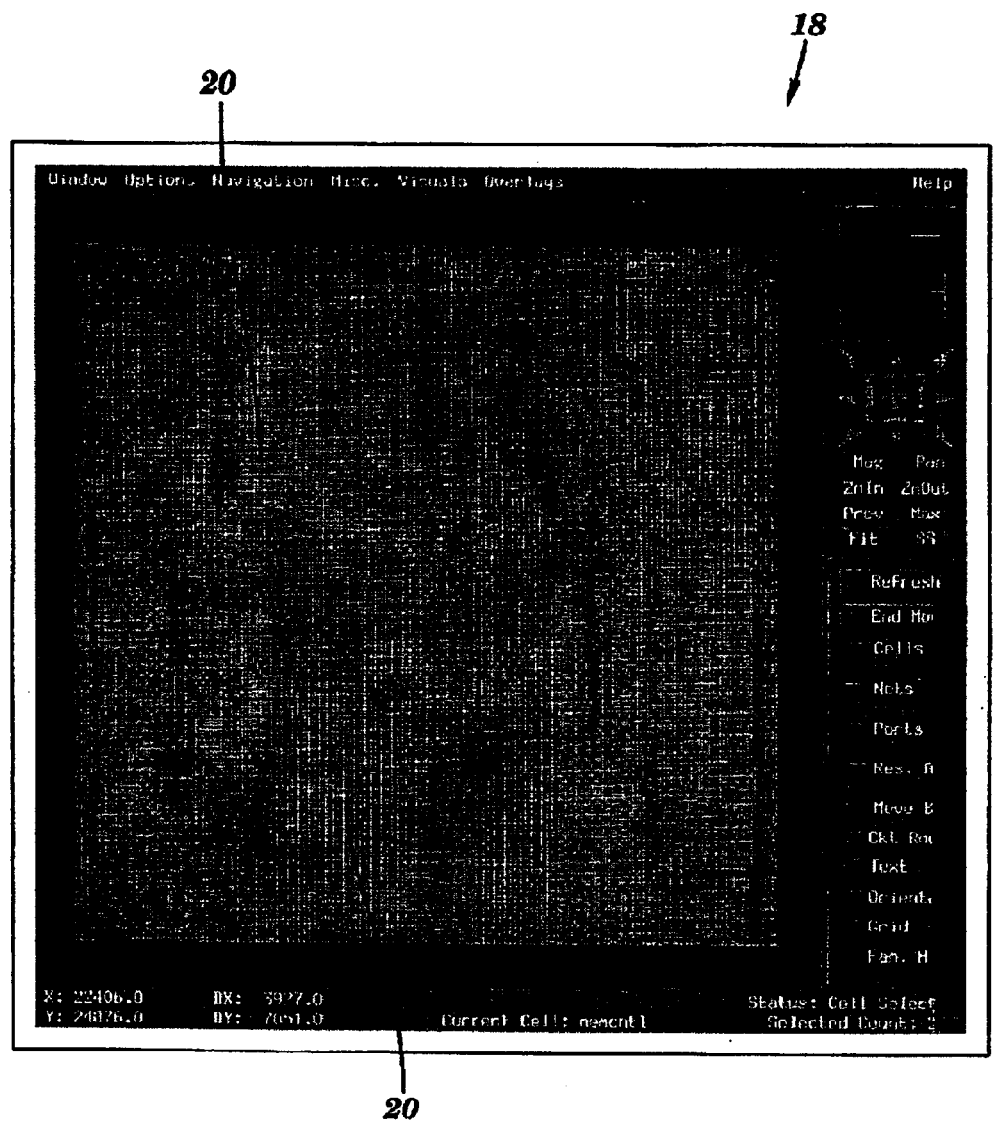
FIG. 2 depicts a thermal graph showing wiring congestion alleviated under the present invention.

FIG. 2 shows a thermal plot 18 of a chip where wiring demand exceeds availability. As depicted, the chip includes numerous "hot spots" 20, which are generally the regions of the chip where the demand for wiring interconnects exceeds the wiring availability. Previous attempts for meeting wiring constraints, and relieving hot spots 20, generally relied upon either: (1) a manual identification of congested areas after wiring interconnects have been made, and subsequent reduction of logic density in the identified areas; or (2) an increase of overall chip area to reduce congestion. However, these solutions are time-consuming and/or costly.

The present invention alleviates wiring congestion by placing logic nodes 12 and 14 on chip 10 based on an estimated wiring congestion. Initially, logic nodes 12 and 14 are positioned on chip 10, chip 10 is partitioned into a first placement level of four bins (quadrants), and the logic nodes are arranged in the four bins using any know approach (e.g., quadratic optimization, min-cut, etc.). Then, to alleviate the hot spots such as those shown in FIG. 2, logic nodes 12 and 14 are relocated within chip 10 to meet wiring constraints.

To relocate logic nodes 12 and 14 to meet wiring constraints, an estimated wiring congestion at particular placement levels is calculated and compared to a wiring availability. To this extent, chip 10 is partitionable into multiple placement levels of bins, with each subsequent placement level increasing the quantity of bins. Specifically, each subsequent placement level partitions each bin of the previous placement level into four sub-bins. For example, a first placement level (i.e., 21) will result in chip 10 having a placement grid of four bins arranged in a 2×2 fashion (i.e., FIG. 1). A second placement level (i.e., 22) will result in chip 10 having a placement grid of sixteen bins arranged in a 4×4 fashion. A third level (23) will result in a chip 10 having a placement grid of sixty-four bins arranged in an 8×8 fashion. It should be understood that although each bin is typically partitioned into four bins under the present invention, other variations exist. For example, each bin could alternatively be partitioned into two bins.

Figure 3:
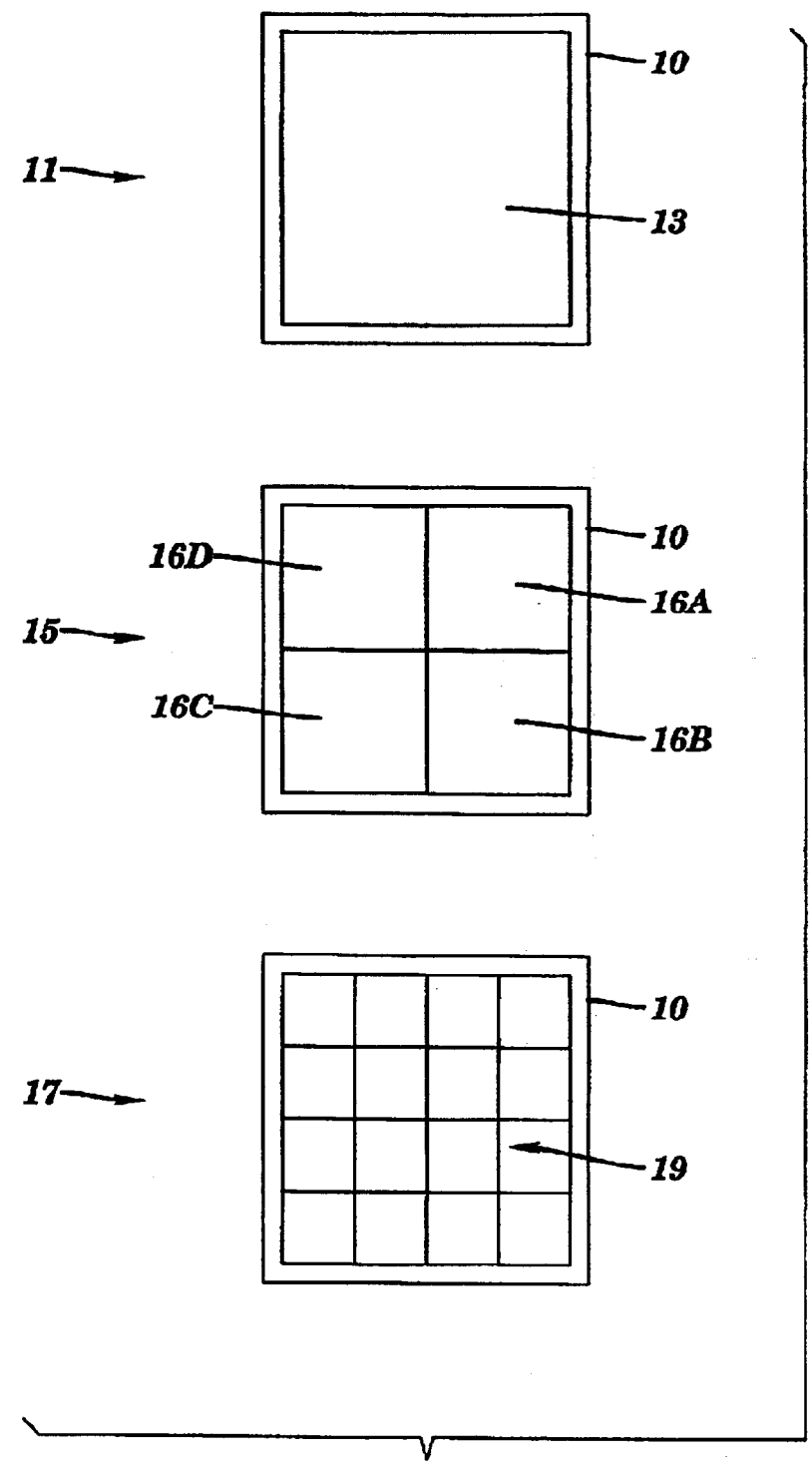
FIG. 3 depicts a hierarchical relationship between multiple placement levels.

FIG. 3 depicts the hierarchical relationship between a zero placement level 11, a first placement level 15 and a second placement level 17. As shown, zero placement level (20) shows chip 10 with no partitions. That is, chip 10 includes a single bin 13. First placement level 15 (21) shows that single bin 13 of zero placement level 11 has been partitioned into four bins or 16A–D. Second placement 17 level (22) shows that each bin 16A–D of first placement level 15 have themselves been partitioned into four bins 19. Chip 10 can be further partitioned for up to approximately twelve placement levels, which would result in a 4096×4096 arrangement of bins (or sub-bins). The present invention begins estimating wiring congestion at the first or subsequent placement level. In a typical embodiment, estimation begins at the third placement level (i.e., 23). However, it should be understood that this need not be the case.

Figure 4:
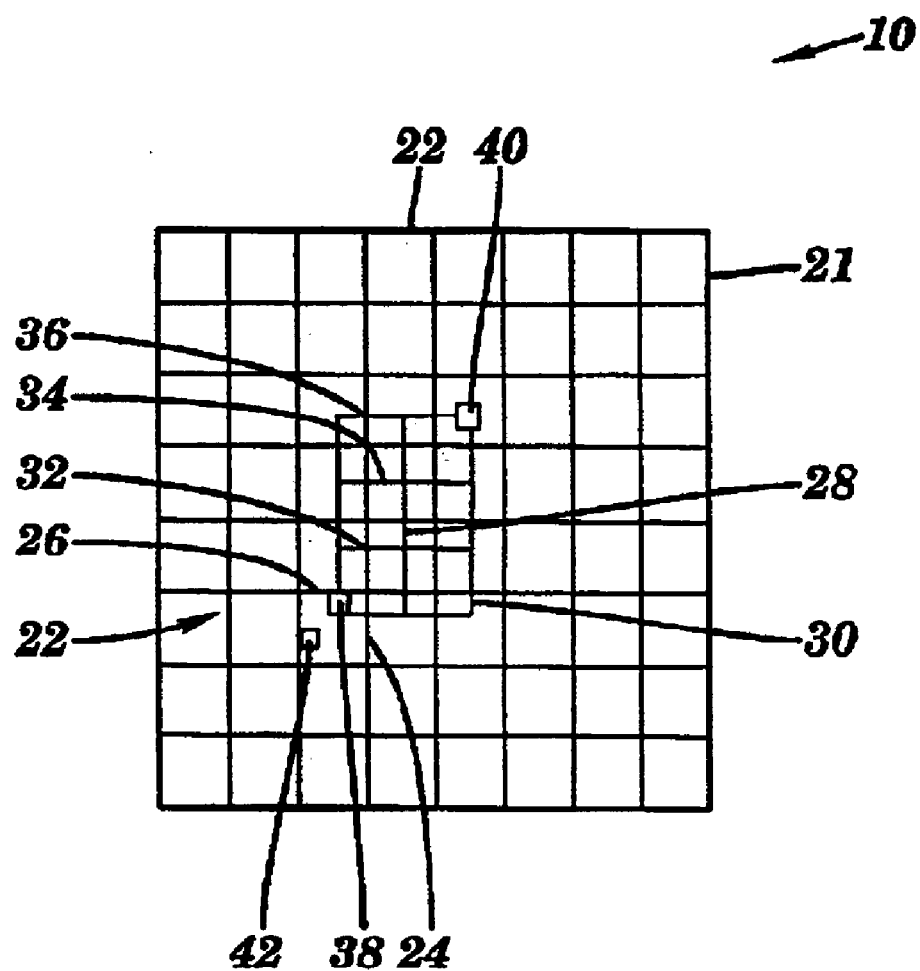
FIG. 4 depicts potential implementations for wiring interconnects between two logic nodes placed on a chip having a wiring level of 8×8 bins.

Referring now to FIG. 4, chip 10 after partitioning into a third placement level (23) is shown in greater detail. Specifically, chip 10 was first partitioned into a first placement level of four bins or quadrants (2×2), into which the logic nodes were arranged (e.g., based on quadratic optimization or min-cut). Then, each of the four bins were partitioned into a second placement level to yield a placement grid of sixteen (4×4) bins (or sub-bins), into which the logic nodes were rearranged (e.g., based on quadratic optimization or min-cut). Then, each of the sixteen bins were partitioned into the third placement level shown to yield a placement grid 21 of 8×8 bins (or sub-bins) 22, into which the logic nodes were further rearranged (e.g., based on quadratic optimization or min-cut).

To estimate the wiring congestion at this third level, potential implementations for wiring interconnects between logic nodes 38, 40 and 42 must first be identified. FIG. 4 shows two logic nodes 38 and 40 between which a wiring interconnect is desired. It should be understood that chip 10 will in fact include millions of logic nodes requiring wiring interconnects therebetween. Only two have been shown for clarity purposes. As further shown in FIG. 4, five potential implementations 28, 30, 32, 34 and 36 for a wiring interconnect between logic nodes 38 and 40 have been identified. Specifically, for instance, the five shortest paths between logic nodes 38 and 40 are shown. A first potential implementation 28 is to proceed one bin over from logic node 38, three bins up, and then one bin over to logic node 40. A second potential implementation 30 is to proceed two bins over from logic node 38 and then three bins up to logic node 40.

A third potential implementation 32 is to proceed one bin up from logic node 38, then two bins over, and then two bins up to logic node 40. A fourth potential implementation 34 is to proceed two bins up from logic node 38, then two bins over, and then one bin up to logic node 40. A fifth potential implementation 36 is to proceed three bins up from logic node 38 and then two bins over to logic node 40.

Once all potential implementations have been identified, a relative probability will be determined for each potential implementation that will cross over an edge 24 or 26 between adjacent bins 22. For example, in connecting logic node 38 to logic node 40, edges 24 and 26 will be crossed by the potential implementations. In determining the relative probabilities of the identified potential implementations, it is assumed, for instance, that all have an equal probability of actually being implemented. Since five potential implementations that cross over an edge of a bin 22 were identified, and all are assumed to be equally likely to be implemented, each potential implementation will be assigned a 20% relative probability.

Once the relative probabilities have been determined, the estimated wiring congestion is calculated based on the totals of relative probabilities corresponding to each edge between adjacent bins 22. Specifically, a total will be determined for each edge between adjacent bins 22 based on the corresponding relative probabilities of the potential implementations that cross over the edges. For example, bin 22 of logic node 38 has two edges 24 and 26 that are crossed over by potential implementations. For each edge crossed over, the total of relative probabilities of the corresponding potential implementations will be determined. Thus, since two potential implementations 28 and 30 (at 20% each) cross over edge 24, a total probability (demand) of 40% will be assigned to edge 24. Similarly, since three potential implementations 32, 34 and 36 (at 20% each) cross over edge 26, a total probability of 60% will be assigned to edge 26. As indicated above, since chip 10 will include more than two logic nodes, virtually every edge between adjacent bins 22 will likely have a total assigned thereto. The determined totals represent an estimated wiring congestion for chip 10.

Once the totals (i.e., estimated wiring congestion) have been determined, each total will be compared to a corresponding wiring availability. It could be that an edge is crossed over by more potential implementations than there are available wiring channels. For example, edge 26 has a total relative probability of 60%, which may use all or approximately all of the available wiring channels. All such edges are considered to be overloaded edges. Similarly, any bin 22 having an overloaded edge is considered to be an overloaded bin 22.

Once overloaded bins 22 are identified, steps can be taken to correct the problem. Specifically, the logic nodes can be placed (i.e., relocated) to meet wiring constraints. Under the present invention, for each overloaded edge of a bin 22, the size of the logic nodes therein will be synthetically adjusted in size by a predetermined percentage. In a typical embodiment, the logic nodes will be synthetically increased in size by 5% for every edge that is overloaded. For example, bin 22 having logic nodes 38 and 42 has two edges 24 and 26 that are crossed over by potential implementations. If it is determined that only edge 26 is overloaded (i.e., 60% total is too high for the wiring availability), logic nodes 38 and 42 will be increased in size by 5%. Similarly, if both edges 24 and 26 are determined to be overloaded, logic nodes 38 and 42 will be increased in size by 10%. Depending on other potential implementations crossing over other edges, logic nodes 38 and 42 could be increased in size up to a maximum of 20%.

The increase in size, although synthetic and not actual, causes fewer nodes to fit within bins 22. This requires that particular nodes (e.g., node 42) be relocated to other (non-overloaded) bins 22 of chip 10. The particular logic nodes to be relocated can be identified based on many factors such as ease of movement, interconnection between other nodes that will remain in bin 22, etc. Typically, the particular logic nodes are relocated by first merging each 2×2 arrangement of overloaded bins into single bins. The particular logic nodes are then rearranged within the single bins to meet wiring availability The single bins are then re-partitioned into 2×2 arrangements of non-overloaded bins. This relocation of particular logic nodes to meet wiring constraints is referred to as placement of the logic nodes because once performed, the placement level is considered to have a legal arrangement of logic nodes. That is, the logic nodes have been placed within wiring constraints (e.g., based on the estimated wiring congestion).

Once the logic nodes have been placed for the given placement level (e.g., third), chip 10 can be partitioned into the subsequent placement level. In this example, chip 10 would be partitioned into a fourth level (i.e., 24) of 16×16 bins 22. The steps would then be repeated. Specifically, potential implementations for wiring interconnects would be determined, and the total of corresponding relative probabilities for each potential implementation would be calculated. Then, for each edge between adjacent bins, the corresponding total would be compared to a wiring availability. Based on the comparison, the logic nodes would be placed (relocated).

Figure 5:
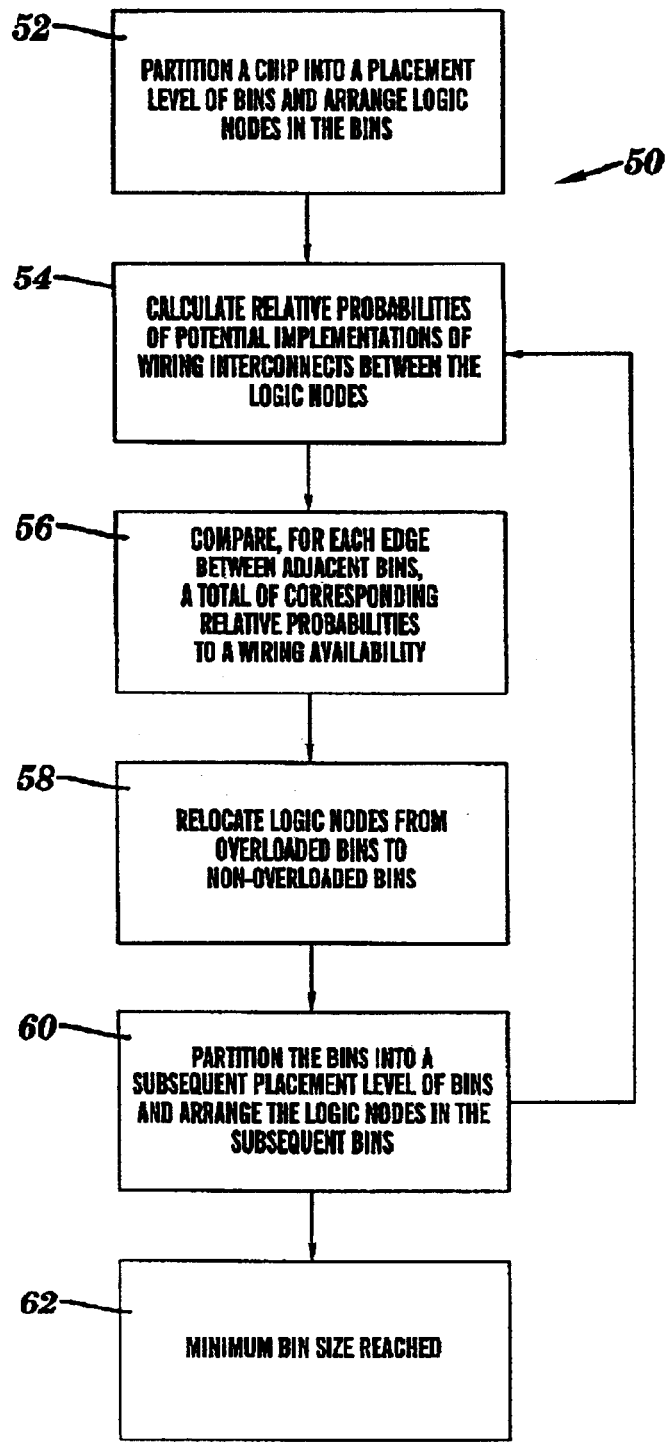
FIG. 5 depicts a method flow chart according to the present invention.

Referring to FIG. 5, a method flow chart 50 according to the present invention is shown. As shown, first step 52 is to partition a chip into a placement level of bins and arrange logic nodes in the bins. This can be accomplished using any known method such as quadratic optimization or min-cut. Once the logic nodes have been arranged, the relative probabilities of potential implementations of wiring interconnects between the logic nodes are calculated 54. Once calculated, the total of corresponding relative probabilities are compared to a wiring availability, for each edge that is crossed over by a potential implementation 56. Based on the comparison, the logic nodes are placed, that is, particular logic nodes are relocated from overloaded bins to non-overloaded bins 58. As described above, this involves merging 2×2 arrangements of overloaded bins into single bins, arranging the logic nodes to meet wiring constraints within the single bins, and then re-partitioning the single bins into 2×2 arrangements of non-overloaded bins. Until a minimum bin size is reached 62, the bins can be partitioned into a subsequent placement level of bins 60 in which the logic nodes are arranged and steps 54, 56 and 58 repeated.

Figure 6:
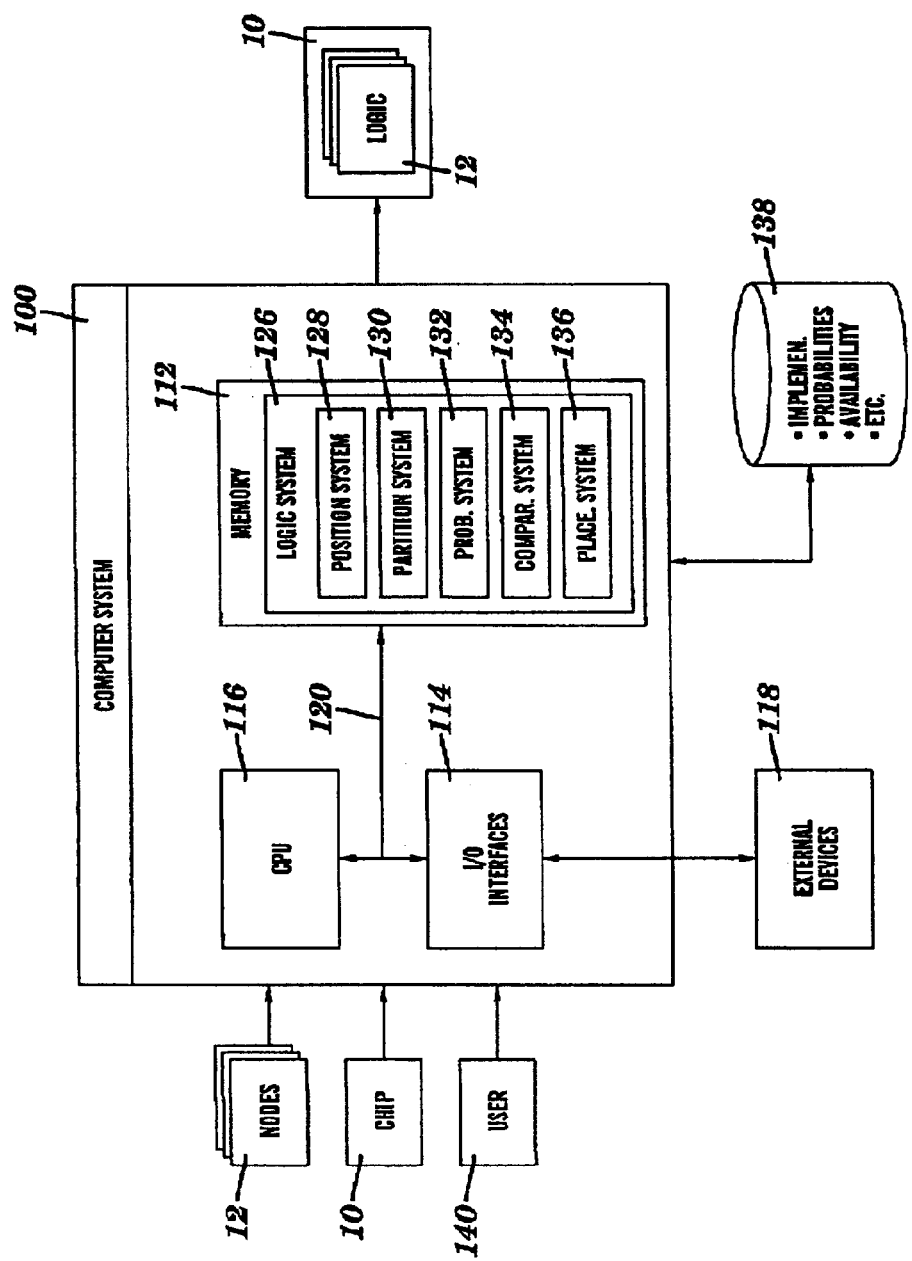
FIG. 6 depicts a computer system implementation of the present invention.

Referring now to FIG. 6, a computer system 100 implementation of the present invention is shown. Specifically, the present invention can be implemented as a computer system 100 and/or program product 126 for virtually placing logic nodes 12 based on an estimated wiring congestion. This would allow user 140 to run simulations before manually performing logic placement. As depicted, computer system 100 generally comprises memory 112, input/output (I/O) interfaces 114, a central processing unit (CPU) 116, external devices/resources 118, bus 120 and database 138. Memory 112 may comprise any known type of data storage and/or transmission media, including magnetic media, optical media, random access memory (RAM), read-only memory (ROM), a data cache, a data object, etc. Moreover, memory 112 may reside at a single physical location, comprising one or more types of data storage, or be distributed across a plurality of physical systems in various forms. CPU 116 may likewise comprise a single processing unit, or be distributed across one or more processing units in one or more locations, e.g., on a client and server.

I/O interfaces 114 may comprise any system for exchanging information from an external source. External devices 118 may comprise any known type of external device, including speakers, a CRT, LED screen, hand-held device, keyboard, mouse, voice recognition system, speech output system, printer, monitor, facsimile, pager, etc. Bus 120 provides a communication link between each of the components in the computer system 100 and likewise may comprise any known type of transmission link, including electrical, optical, wireless, etc. In addition, although not shown, additional components, such as cache memory, communication systems, system software, etc., may be incorporated into computer system 100.

Database 138 provides storage for information necessary to carry out the present invention. Such information could include, inter alia: (1) probabilities; (2) potential implementations; (3) wiring availability; etc. Database 138 may include one or more storage devices, such as a magnetic disk drive or an optical disk drive. In another embodiment database 138 includes data distributed across, for example, a local area network (LAN), wide area network (WAN) or a storage area network (SAN) (not shown). Database 138 may also be configured in such a way that one of ordinary skill in the art may interpret it to include one or more storage devices. Moreover, it should be understood that database 138 could alternatively exist within computer system 10.

Stored in memory 112 is logic system 126. As depicted, logic system 126 generally includes position system 128, partition system 130, probability system 132, comparison system 134 and placement system 136. The systems shown herein carry out the functions described above. Specifically, logic system 126 allows logic nodes 12 to be placed on chip 10 within wiring constraints.

Position system 128 will initially position logic nodes 12 on chip 10. Once positioned, chip 10 will be partitioned into a first placement level of four bins or quadrants by partition system 130, and the logic nodes 12 will be arranged in the four bins by position system 128 (e.g., based on quadratic optimization or min-cut). At a predetermined placement level (e.g., the first, second or third placement level), probability system 132 will determine the potential implementations for wiring interconnects between logic nodes 12 on chip 10, and calculate/determine a relative probability for each implementation identified.

Figure 7:
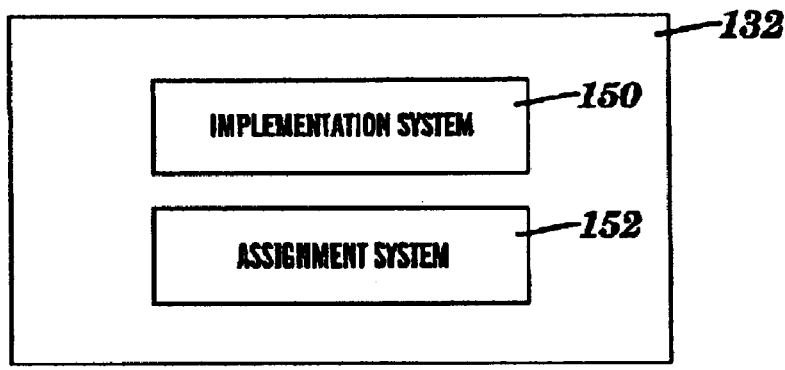
FIG. 7 depicts a box diagram of the probability system of FIG. 6.

Referring to FIG. 7, probability system 132 includes implementation system 150 and assignment system 152. Implementation system identifies potential implementations based on, for instance, the shortest path between the logic nodes 12 in the bins of chip 10. This can be determined based on logic node locations as programmed by user 140 and stored in database 122. Assignment system 152 will then determine and assign a relative probability to each identified implementation. In determining the relative probabilities, assignment 152 will assume, for instance, that each potential implementation has an equal chance of occurring. Accordingly, if five potential implementations are identified, each potential implementation will be assigned a relative probability of 20%.

Referring back to FIG. 6, comparison system 134 will compare, for each edge between adjacent bins crossed over by a potential implementation, a corresponding total of relative probabilities (i.e., an estimated wiring congestion) to a wiring availability (as programmed by user 140) to identify overloaded edges/bins. Based on the comparison, placement system 136 will place the logic nodes in the bins.

Figure 8:
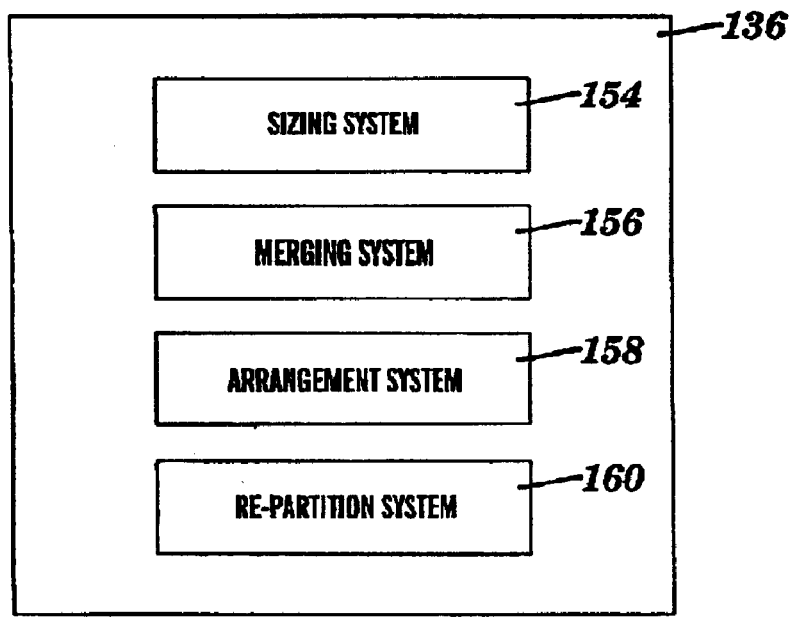
FIG. 8 depicts a box diagram of the placement system of FIG. 6.

Referring to FIG. 8, placement system 136 is shown as including sizing system 154, merging system 156, arrangement system 158 and re-partition system 160. Based on the quantity of overloaded edges in an overloaded bin, sizing system 154 will synthetically increase a size of the logic node contain in the overloaded bin. As indicated, above, this typically results in a synthetic 5% increase in size for each overloaded edge. Once the size of the logic nodes in the overloaded bins has been increased, merging system 156 will merge each 2×2 arrangement of overloaded bins into a single bin. Arrangement system 158 will then arrange the logic nodes among the single bin so that wiring constraints are met. Re-partition system 160 will then re-partition the single bins into 2×2 arrangements of non-overloaded bins. Once placed, chip 10 can be further partitioned by partition system 130 into a subsequent placement level of bins, and the process can be repeated. In the end, a virtual simulation of logic nodes 12 arranged on chip 10 can be presented to user 140.

It is understood that the present invention can be realized in hardware, software, or a combination of hardware and software. Moreover, computer system 100 according to the present invention can be realized in a centralized fashion in a single computerized workstation, or in a distributed fashion where different elements are spread across several interconnected systems (e.g., a network). Any kind of computer/server system(s)—or other apparatus adapted for carrying out the methods described herein—is suited. A typical combination of hardware and software could be a general purpose computer system with a computer program that, when loaded and executed, controls computer system 100 such that it carries out the methods described herein. Alternatively, a specific use computer, containing specialized hardware for carrying out one or more of the functional tasks of the invention could be utilized. The present invention can also be embedded in a computer program product, which comprises all the features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims For example, as indicated above, each bin need not be divided into four bins to form a subsequent placement level. Rather each bin could be partitioned into two or any other quantity of bins. Moreover, it should be understood that the local reduction in logic density disclosed herein could be based on criteria other than wiring congestion. For example, the reduction in logic density could be based on local voltage drop whereby given the information on switching time intervals and switching capacitances, and a criteria for calculating voltage drop based thereon, the logic in the bins exceeding the voltage drop limit will be enlarged. This will create additional space for decap circuits, which will be inserted after final logic placement.

What is claimed is:

1. A method for placing logic nodes based on an estimated wiring congestion, comprising the steps of:

calculating an estimated wiring congestion for a placement level of bins based on relative probabilities that potential implementations of wiring interconnects between logic nodes in the bins will cross over edges of the bins;

comparing the estimated wiring congestion to a wiring availability; and placing the logic nodes in the bins based on the comparison of the estimated wiring congestion to the wiring availability.

2. The method of claim 1, wherein the calculating step comprises the steps of:

identifying potential implementations of wiring interconnects between logic nodes that will cross over edges of the bins;

calculating a relative probability for each of the potential implementations that will cross over an edge of the bins; and determining, for each edge between adjacent bins, a total of corresponding relative probabilities.

3. The method of claim 2, wherein the comparing step comprises comparing, for each edge between adjacent bins, the determined total to a wiring availability.

4. The method of claim 1, wherein the placing step comprises:

adjusting a size of the logic nodes in overloaded bins; and relocating particular logic nodes from the overloaded bins to non-overloaded bins.

5. The method of claim 4, wherein the adjusting step comprises increasing a size of the logic nodes in the overloaded bins based on the comparison.

6. The method of claim 4, wherein the placing step comprises:

merging a two by two arrangement of overloaded bins into a single bin;

arranging logic nodes from the overloaded bins in the single bin; and re-partitioning the single bin into a two by two arrangement of non-overloaded bins.

7. The method of claim 1, further comprising the steps of:

partitioning the bins into a subsequent placement level of bins;

calculating an estimated wiring congestion of the subsequent placement level; and relocating logic nodes from overloaded bins in the subsequent placement level to non-overloaded bins in the subsequent placement level.

8. A method for placing logic nodes based on an estimated wiring congestion, comprising:

providing a placement grid having a predetermined placement level of bins;

calculating relative probabilities for potential implementations of wiring interconnects between logic nodes that will cross over an edge of the bins;

comparing, for each edge between adjacent bins, a total of corresponding relative probabilities to a wiring availability for identifying overloaded bins;

synthetically adjusting a size of the logic nodes in the overloaded bins based on the comparison; and relocating particular logic nodes from the overloaded bins to non-overloaded bins.

9. The method of claim 8, further comprising the step of calculating an estimated wiring congestion by determining, for each edge between adjacent bins, a total of corresponding relative probabilities.

10. The method of claim 8, wherein the calculating step comprises the steps of:

identifying potential implementations of wiring interconnects between logic nodes that will cross over an edge of the bins; and calculating relative probabilities for each of the potential implementations.

11. The method of claim 8, wherein the adjusting step comprises the step of increasing a size of the logic nodes in the overloaded bins based on a quantity of overloaded edges of the overloaded bins.

12. The method of claim 8, wherein the providing step comprises:

positioning logic nodes on a chip;

partitioning the chip into bins; and arranging the logic nodes in the bins.

13. The method of claim 8, further comprising the step of:

partitioning the placement grid into a subsequent placement level of bins;

calculating relative probabilities for potential implementations of wiring interconnects between logic nodes that will cross over an edge of the bins in the subsequent placement level;

comparing, for each edge between adjacent bins in the subsequent placement level, a total of corresponding relative probabilities to a wiring availability for identifying overloaded bins; and adjusting a size of the logic nodes in the overloaded bins in the subsequent placement level based on the comparison.

14. The method of claim 8, wherein the relocating step comprises:

merging a two by two arrangement of overloaded bins into a single bin;

arranging logic nodes from the overloaded bins in the single bin; and re-partitioning the single bin into a two by two arrangement of non-overloaded bins.

15. A system for placing logic nodes based on an estimated wiring congestion, comprising:

a partition system for partitioning a chip into a placement level of bins;

a positioning system for positioning logic nodes in the bins;

a probability system for determining relative probabilities for potential implementations of wiring interconnects between the logic nodes that will cross over an edge of the bins;

a comparison system for comparing, for each edge between adjacent bins, a total of corresponding relative probabilities to a wiring availability; and a placement system for placing the logic nodes in the bins based on the comparison.

16. The system of claim 15, wherein the placement system comprises:

a sizing system for adjusting a size of the logic nodes in overloaded bins based a quantity of overloaded edges in the overloaded bins;

a merging system for merging a two by two arrangement of overloaded bins into a single bin;

an arrangement system for arranging logic nodes from the overloaded bins in the single bin; and a re-partition system for partitioning the single bin into a two by two arrangement of non-overloaded bins.

17. The system of claim 15, wherein the placement system relocates particular logic nodes in the overloaded bins to non-overloaded bins.

18. The system of claim 15, wherein the probability system comprises:

a interconnect system for identifying potential implementations of wiring interconnects between the logic nodes; and an assignment system for assigning a relative probability to each of the potential implementations.

19. A program product stored on a recordable medium for placing logic nodes based on an estimated wiring congestion, which when executed comprising:

program code for partitioning a chip into a placement level of bins;

program code for arranging logic nodes in the bins;

program code for determining relative probabilities for potential implementations of wiring interconnects between the logic nodes that will cross over edges of the bins;

a program code for comparing, for each edge between adjacent bins, a total of corresponding relative probabilities to a wiring availability; and program code for placing the logic nodes in the bins based on the comparison.

20. The program product of claim 19, wherein the program code for placing comprises:

program code for adjusting a size of the logic nodes in overloaded bins based a quantity of overloaded edge in the overloaded bins;

program code for merging a two by two arrangement of overloaded bins into a single bin;

program code for arranging logic nodes from the overloaded bins in the single bin; and program code for partitioning the single bin into a two by two arrangement of non-overloaded bins.

21. The program product of claim 19, wherein the program code for placing the logic nodes relocates particular logic nodes in overloaded bins to non-overloaded bins.

22. The program product of claim 19, wherein the program code for determining relative probabilities comprises:

program code identifying wiring interconnects between the logic nodes; and program code for determining a relative probability to each of the potential implementation of wiring interconnects.

* * * * *